United States Patent
Park et al.

(10) Patent No.: US 9,684,552 B2
(45) Date of Patent: Jun. 20, 2017

(54) METHOD FOR DRIVING NONVOLATILE MEMORY DEVICE

(71) Applicant: SAMSUNG ELECTRONICS CO., LTD., Hwaseong-si, Gyeonggi-do (KR)

(72) Inventors: Eun-Hye Park, Iksan-si (KR); Jun-Ho Shin, Hwaseong-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 55 days.

(21) Appl. No.: 14/680,502

(22) Filed: Apr. 7, 2015

(65) Prior Publication Data

US 2015/0286567 A1 Oct. 8, 2015

(30) Foreign Application Priority Data

Apr. 7, 2014 (KR) .......................... 10-2014-0041330

(51) Int. Cl.
*G11C 11/00* (2006.01)
*G06F 11/00* (2006.01)
*G11C 16/34* (2006.01)
*G06F 12/02* (2006.01)

(52) U.S. Cl.
CPC .......... *G06F 11/00* (2013.01); *G11C 16/3459* (2013.01); *G06F 12/0246* (2013.01); *G06F 2212/1032* (2013.01)

(58) Field of Classification Search
CPC .. G06F 11/00; G06F 12/0246; G06F 12/0882; G06F 2212/1032; G11C 16/3459
See application file for complete search history.

(56) References Cited

U.S. PATENT DOCUMENTS

| | | | |
|---|---|---|---|
| 7,085,087 B2 | 8/2006 | Fukuhisa et al. | |
| 7,701,757 B2 | 4/2010 | Kim et al. | |
| 7,796,427 B2 | 9/2010 | Kim et al. | |
| 7,852,659 B2 | 12/2010 | Kang et al. | |
| 7,881,101 B2 | 2/2011 | Kim et al. | |
| 8,045,368 B2 | 10/2011 | Em | |
| 2009/0010057 A1* | 1/2009 | Tsuji | G06F 12/0246 365/185.03 |
| 2009/0103203 A1 | 4/2009 | Yoshida | |
| 2009/0150597 A1 | 6/2009 | Yang et al. | |
| 2011/0066900 A1* | 3/2011 | Tokiwa | G11C 13/0007 714/704 |
| 2012/0134203 A1 | 5/2012 | Miura et al. | |

(Continued)

FOREIGN PATENT DOCUMENTS

| | | |
|---|---|---|
| JP | 2013-137861 | 7/2013 |
| JP | 2013-168015 | 8/2013 |

(Continued)

*Primary Examiner* — Toan Le
(74) *Attorney, Agent, or Firm* — Volentine & Whitt, PLLC

(57) ABSTRACT

A method for driving a nonvolatile memory device using a resistive element is provided. The method includes storing data in a page buffer, the data including a first data block and a second data block, writing the first data block to a memory cell, performing a verify-read operation on the first data block of the memory cell region, writing the second data block to the memory cell region, and performing a verify-read operation on the second data block of the memory cell region, wherein the first data block and the second data block are smaller than the page buffer in size.

20 Claims, 13 Drawing Sheets

(56) References Cited

U.S. PATENT DOCUMENTS

| | | | | |
|---|---|---|---|---|
| 2012/0155186 A1* | 6/2012 | Chokan | ............. | G11C 16/3459 |
| | | | | 365/185.22 |
| 2013/0279249 A1 | 10/2013 | Yun et al. | | |
| 2014/0149827 A1* | 5/2014 | Kim | ................... | G06F 11/1064 |
| | | | | 714/764 |
| 2014/0169068 A1* | 6/2014 | Lee | ................... | G11C 13/0064 |
| | | | | 365/148 |
| 2014/0351487 A1* | 11/2014 | Kim | ................... | G11C 16/107 |
| | | | | 711/103 |

FOREIGN PATENT DOCUMENTS

| | | |
|---|---|---|
| WO | WO2010038736 A1 | 4/2010 |
| WO | WO2013121596 A1 | 8/2013 |

\* cited by examiner

METHOD FOR DRIVING NONVOLATILE MEMORY DEVICE

CROSS-REFERENCE TO RELATED APPLICATION

A claim of priority is made to Korean Patent Application No. 10-2014-0041330 filed on Apr. 7, 2014, in the Korean Intellectual Property Office, the contents of which are herein incorporated by reference in their entirety.

BACKGROUND

The present inventive concept relates to a method for driving a nonvolatile memory device having memory cells which include, for example, a resistive element.

Certain types of nonvolatile memory devices utilize a material (herein a resistance material) having a programmable resistance characteristic to store data. Examples of such devices include phase change random access memories (PRAMs) or phase change memories (PCMs), resistive RAMs (RRAMs), magnetic RAMs (MRAMs), and the like. Depending on the type of memory device, the resistance material may be a phase change material such as a chalcogenide alloy (in the case of a PRAM), a variable resistance material (in the case of an RRAM), a magnetic tunnel junction (MTJ) thin film (in the case of an MRAM), and the like.

In the case of a phase change material, for example, the material may be changed to a relatively crystalline state or a relatively amorphous state by selective controlling heating and subsequent cooling of the material. The phase change material in the crystalline state exhibits a lower resistance than in the amorphous state. In conventional nomenclature, the low resistance crystalline state is referred to as a set state, and the high resistance amorphous state is referred to as a reset state.

SUMMARY

According to an aspect of the present inventive concept, a method for driving a nonvolatile memory device is provided which includes storing data in a page buffer such that both a first data block among the data and a different second data block among the data are stored in the page buffer, writing the first data block stored in the page buffer to a first memory cell region, performing a verify-read operation on the first data block written to the first memory cell region, and writing the second data block stored in the page buffer to a second memory cell region, and performing a verify-read operation on the second data block written to the second memory cell region.

According to another aspect of the present inventive concept, a method for driving a nonvolatile memory device is provided which includes storing data in a page buffer such that both a first data block among the data and a different second data block among the data are stored in the page buffer, writing the first data block to a memory cell region, writing the second data block to the memory cell region after writing the first data block to the memory cell region, and performing a verify-read operation on the first and second data blocks of the memory cell region.

According to still another aspect of the present inventive concept, a method for driving a nonvolatile memory device which includes a page buffer connected to a nonvolatile memory array including a plurality of resistive memory cells is provided. The method includes loading the page buffer with N blocks of data, where N is a natural number of 2 or more, and performing program sequences in succession for the N blocks respectively. Each program sequence includes writing a one of the N blocks stored in the page buffer to the memory array, read-verifying the one of the N blocks written to the memory array to obtain a read-verity result, rewriting the one of the N blocks to the memory array when the read-verify result is a fail, and completing the program sequence for the one of the N blocks when the read-verify result is a pass.

BRIEF DESCRIPTION OF THE DRAWINGS

The above and other features and advantages of the present inventive concept will become readily apparent from the detailed description that follows with reference to the attached drawings in which.

DETAILED DESCRIPTION OF THE EMBODIMENTS

Figure 1:
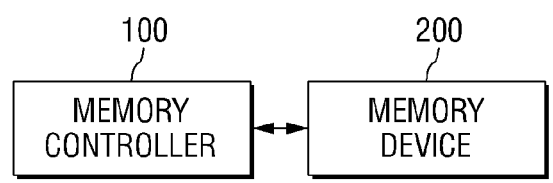
FIG. 1 is a block diagram of a memory system according to an embodiment of the present inventive concept.

Aspects and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims. Like reference numerals refer to like elements throughout the specification.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, exemplary embodiments of the present inventive concept will be described in the case where resistive memory cells including a resistance material are utilized to store data in a nonvolatile manner. The primary example adopted herein is a phase change memory device, i.e. a phase change RAM (PRAM). However, it will be apparent to those of ordinary skill in the art to which the present inventive concept pertains that the present inventive concept is not limited by memory cell type. For example, other nonvolatile memories using resistance materials can be adopted, such as a resistive RAM (RRAM), a ferroelectric RAM (FRAM), and the like.

FIG. 1 is a block diagram of a memory system according to an embodiment of the present inventive concept.

Referring to FIG. 1, the memory system 1 according to an embodiment of the present inventive concept includes a memory controller 100 and a memory device 200.

The memory controller 100 is configured to control the memory device 200 in response to a request from a host (not shown). For example, the memory controller 100 may be configured to control write, read and erase operations of the memory device 200. The memory controller 100 is configured to drive firmware for controlling the memory device 200.

The memory device 200 includes a plurality of memory cells is configured to store data. The memory device 200 may be a nonvolatile memory device including nonvolatile memory cells, such as resistive memory cells. As one specific example, the memory device 200 may include phase-change memory cells.

Figure 2:
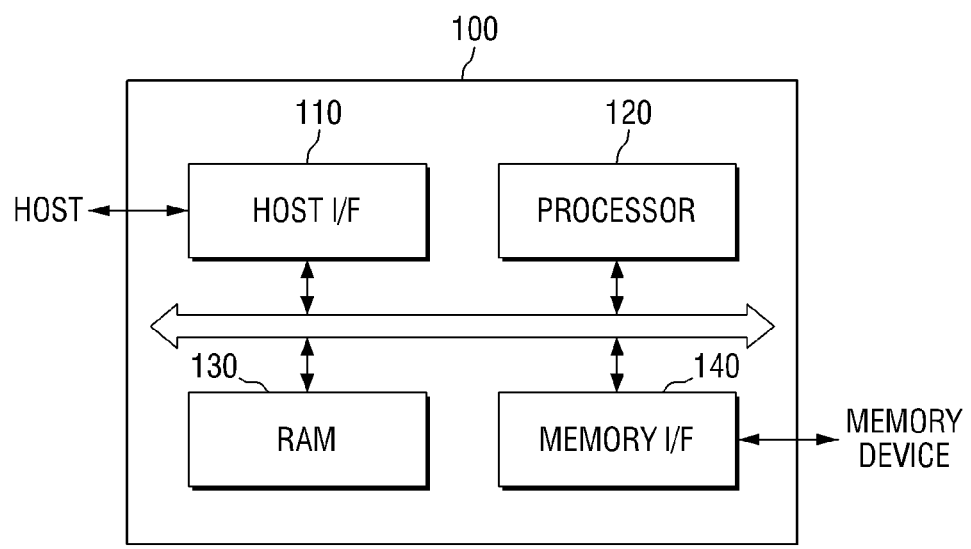
FIG. 2 is a block diagram illustrating an example of a memory controller shown in FIG. 1.

FIG. 2 is a block diagram illustrating an example of the memory controller 100 shown in FIG. 1.

Referring to FIG. 2, the memory controller 100 includes a host interface (I/F) 110, a processor 120, a buffer memory 130, and a memory I/F 140.

The host interface 110 may be configured to interface with a host. For example, the host interface 110 may be configured to include at least one of various standardized interface protocols such as Universal Serial Bus (USB), Multimedia Card (MMC), Peripheral Component Interconnection (PCI), PCI-Express (PCI-E), Advanced Technology Attachment (ATA, Parallel-ATA, pATA), Serial-ATA (SATA), Small Computer Small Interface (SCSI), Enhanced Small Disk Interface (ESDI), and Integrated Drive Electronics (IDE).

The processor 120 may be configured to control the overall operation of the memory controller 100.

The buffer memory 130 may receive data to be programmed to the memory device 200 from the host and may temporarily store the received data. During a program operation of the memory device 200, the data temporarily stored in the buffer memory 130 may be transmitted to the memory device 200 to then be programmed. The buffer memory 130 may receive data received from the memory device 200 and may temporarily store the received data. For example, the buffer memory 130 may be a static RAM (SRAM), but aspects of the present inventive concept are not limited thereto.

The memory I/F 140 may be configured to interface with the memory device 200. For example, the memory I/F 140 may be configured to include NAND interface protocols, but aspects of the present inventive concept are not limited thereto.

Although not shown in FIG. 2, the memory controller 100 may further include other components such as an error correction block. The error correction block may be configured to detect errors of the data read from the memory device 200 using an error correcting code (ECC) and to correct the detected errors.

The error correction block may be provided as a component of the memory controller 100. Alternatively, the error correction block may also be provided as a component of the memory device 200.

Figure 3:
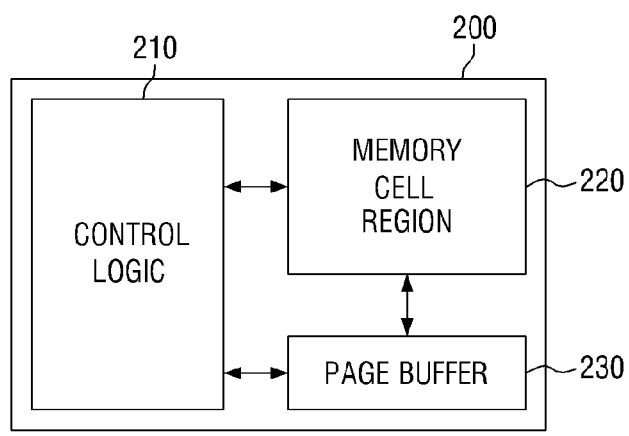
FIG. 3 is a block diagram illustrating an example of a memory device shown in FIG. 1.

FIG. 3 is a block diagram illustrating an example of the memory device 200 shown in FIG. 1.

Referring to FIG. 3, the memory device 200 includes a control logic 210, a memory cell region 220, and a page buffer 230.

The control logic 210 may be configured to control the overall operation of the memory device 200.

The memory cell region 220 is provided as a data storage space. In some embodiments of the present inventive concept, the memory cell region 220 may be a phase change random access memory (PRAM) or phase change random memory (PCM), a resistive RAM (RRAM), a magnetic RAM (MRAM), and the like.

The page buffer 230 may write data to the memory cell region 220 or may read data from the memory cell region 220 in response to a request from the control logic 210. During a program operation of the memory device 200, the page buffer 230 may temporarily store page data to be written to the memory cell region 220. On the other hand, during a read operation of the memory device 200, the page buffer 230 may temporarily store page data which is read from the memory cell region 220. In some embodiments of the present inventive concept, the data stored in the page buffer 230 may have a size sufficient to be compatible with a NAND flash memory device. For example, a unit size of data stored in the page buffer 230 may be 4 KB.

Figure 4:
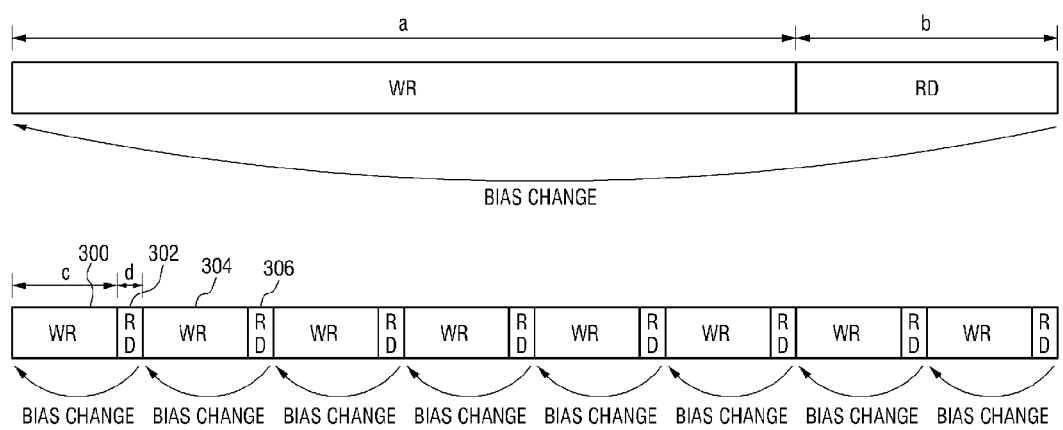
FIG. 4 is a diagram for reference in describing a method for driving a nonvolatile memory device according to an embodiment of the present inventive concept.

FIG. 4 is a diagram for reference in describing a method for driving a nonvolatile memory device according to an embodiment of the present inventive concept.

Referring to FIG. 4, the method for driving a nonvolatile memory device according to an embodiment of the present inventive concept includes alternately performing a plurality of write operations and a plurality of verify-read operations to store the data stored in the page buffer 230 in the memory cell region 220. Here, the data write and verify-read operations may be performed by the memory controller 100 or the control logic 210 of the memory device 200, but aspects of the present inventive concept are not limited thereto. In the following description, for the sake of convenient explanation, it is assumed that it is the memory controller 100 that performs various operations, including a write operation, a verify-read operation of data, or the like.

The top portion of FIG. 4 (and FIGS. 6, 8, 10, 12 and 14) illustrates for comparison a manner of programming which would be comparable to NAND flash programming First, during a period 'a', the data of the entire page buffer (e.g., 4 KB of data) are written, and then during a period 'b' a read-verify is carried out by reading the written data. In the case where the read-verify is a fail, another sequence of write and read-verify operations are carried out. In this sense, the write WR of period 'a' and the read-verify RD of period 'b' may be considered a program sequence which is repeated until the read-verify RD is a pass (or until a given loop count is exceeded without a pass). Also, where the memory cells are resistive memory cells, a DC bias may be changed prior to each new sequence of write and read-verify operations, i.e., after each failed read verify.

The bottom portion of FIG. 4 represents an embodiment of the present inventive concept. Here, the data stored in the page buffer 230 is divided or segmented into a plurality of data blocks. For example, the data stored in the page buffer 230 may be segmented into at least a first data block and a second data block. The memory controller 100 performs a write operation 300 on the first data block of the memory cell region 220 and then performs a verify-read operation 302 on the first data block of the memory cell region 220. Thereafter, the memory controller 100 performs a write operation 304 on the second data block of the memory cell region 220 and then performs a verify-read operation 306 on the second data block of the memory cell region 220. As explained below in connection with FIG. 5, the operations 300 and 302 may constitute a program sequence which is repeated until the verify read is a pass, and likewise the operations 304 and 306 may constitute a program sequence which is repeated until the verify read is a pass.

As described previously in connection with the top portion of FIG. 4, in the case of NAND flash memory devices, data write and verify-read operations are performed with respect to all the data stored in the page buffer 230. In the case of resistive memory devices, however, such a technique may create the need for a substantial write current, which can be problematic. In embodiments of the present inventive concept, a smaller write current may be utilized since the data stored in the page buffer 230 is segmented into a plurality of data blocks when performing the write operations.

That is, referring to FIG. 4, a unit size of data at 'c' of a write operation performed in the memory cell region 220 is smaller than a size at 'a' of the page buffer 230, and a unit size at 'd' of a verify-read operation performed in the memory cell region 220 is also smaller than a size at 'b' of the page buffer 230.

In the embodiment illustrated in FIG. 4, in order to store the data stored in the page buffer 230 in the memory cell region 220, 8 write/verify-read operations (or 8 write/read-verify program sequences) are sequentially performed.

Here, the number of write/verify-read operations is determined by number of data blocks.

As mentioned above, the write/read-verify operations may constitute a program sequence which is repeated until the read-verify is a pass. In this case, the memory controller 100 may rewrite the first data block to the memory cell region 220 after performing the verify-read operation 302 on the first data block of the memory cell region 220. More specifically, the memory controller 100 compares the first data block stored in the page buffer 230 with the verified-read first data block of the memory cell region 220 and determines whether or not they are identical with each other. If the first data block stored in the page buffer 230 is identical with the verified-read first data block of the memory cell region 220, the write operation 300 of the first data block is determined as a success (pass), and if not, the write operation 300 of the first data block is determined as a failure (fail). In the latter case, the memory controller 100 may rewrite the first data block to the memory cell region 220, and then conduct another comparison between the first data block stored in the page buffer 230 with the verified-read first data block of the memory cell region 220. This process may be repeated until the write operation 300 of the first data block is determined as a pass. The remaining blocks may be similarly written. That is, the memory controller 100 may rewrite the second data block to the memory cell region 220 after performing the verify-read operation 306 on the second data block of the memory cell region 220.

In some embodiments of the present inventive concept, the rewriting of the first data block or the second data block to the memory cell region 220 may include changing a voltage bias applied to the memory cell region 220. In addition, in some embodiments of the present inventive concept, the rewriting of the first data block or the second data block to the memory cell region 220 may include performing incremental step pulse programming (ISPP) on the memory cell region 220.

Figure 5:
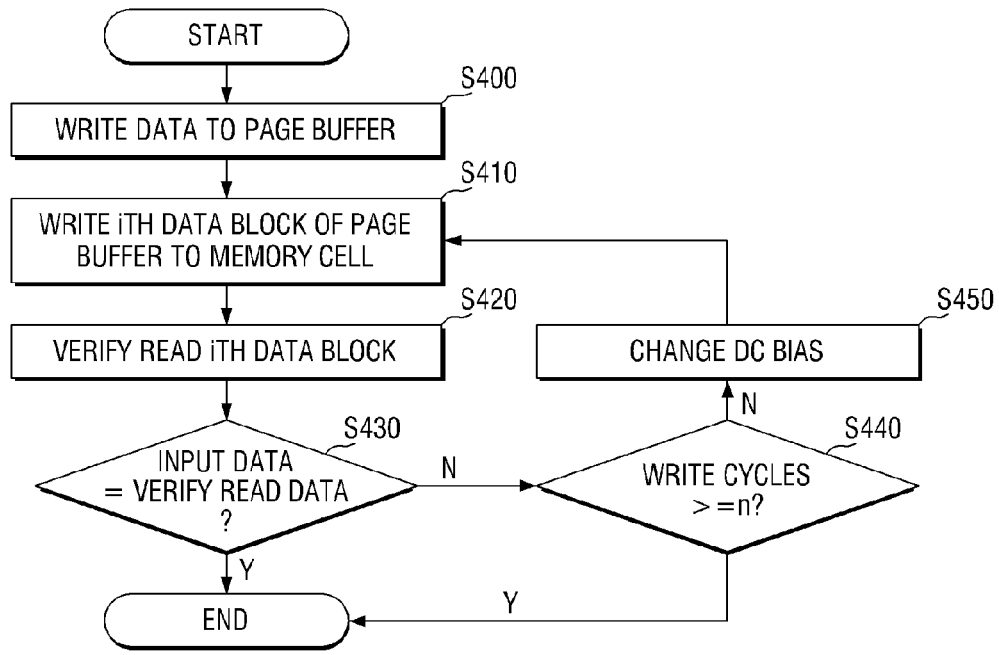
FIG. 5 is a flowchart for further reference in describing the method for driving a nonvolatile memory device associated with FIG. 4.

FIG. 5 is a flowchart for reference in describing the method for driving a nonvolatile memory device associated with FIG. 4. The process steps S410 through S450 shown in FIG. 5 are sequentially performed with respect to each of the data blocks segmented from among the data of the page buffer.

Referring to FIGS. 2, 3, 4 and 5, the method for driving a nonvolatile memory device may include writing data to the page buffer 230 (S400) and writing an ith data block of the page buffer 230 to the memory cell region 220 (S410). Here, i is a natural number in a range between 1 and N, where the data stored in the page buffer 230 is segmented into N data blocks, and where N is a natural number of 2 or more.

Next, a verify-read operation may be performed on an ith data block of the memory cell region 220 (S420), and a determination is made as to whether input data (that is, the ith data block stored in the page buffer 230) is identical with the verified-read data (that is, the ith data block of the memory cell region 220) (S430). If the input data is not identical with the verified-read data, a determination is made as to whether the number of write cycles (i.e., the number of program loops) is equal to or greater than a critical value 'n' (S440). If the number of write cycles is less than the critical value, the DC bias is changed (S450) and another program loop is carried out by rewriting the ith data block to the memory cell region 220 (S410) and determining whether the input data (that is, the ith data block stored in the page buffer 230) is identical with the written and verified-read data (that is, the ith data block of the memory cell region 220) (S430). These process are repeated until either the input data is the same as the verify read data (Yes at S430) or the number of write cycles reaches the critical value (Yes at S440). In the later case, the write operation is considered a failed operation.

In the embodiment shown in FIGS. 4 and 5, after steps S410 to S450 are performed on the ith data block, the steps S410 to S450 are also performed with respect to each of the remaining (i+1)th through Nth data blocks in succession.

Figure 6:
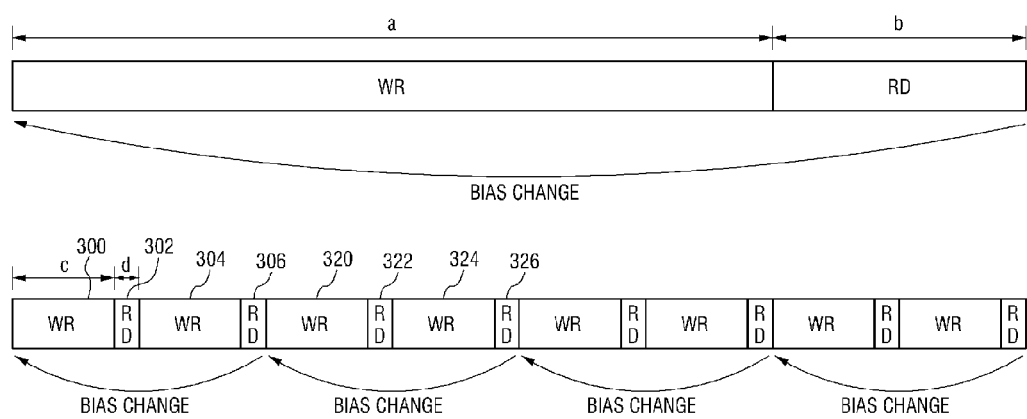
FIG. 6 is a diagram for reference in describing a method for driving a nonvolatile memory device according to another embodiment of the present inventive concept.

FIG. 6 is a diagram illustrating a method for driving a nonvolatile memory device according to another embodiment of the present inventive concept.

Referring to FIG. 6, the method for driving a nonvolatile memory device according to another embodiment of the present inventive concept includes alternately performing a plurality of write operations and a plurality of verify-read operations to store the data stored in a page buffer 230 in a memory cell region 220. In contrast to the method associated with FIGS. 4 and 5, each program loop of the method represented by FIG. 6 includes a sequence of a write operation 300 of a first data block, a read-verify operation 304 of the first data block, a write operation 304 of a second data block, and a read-verify operation of the second data block. In addition, when either or both of the read-verify operations 302 and 306 is a fail, the DC bias is changed prior again performing the program loop. In other words, in the illustrated embodiment, a memory controller 100 writes both of the first data block and the second data block (300 and 304), then performs verify-read operations 302 and 306 on both of the first data block and the second data block, and rewrites the first data block and the second data block with an adjusted DC bias when the verify-read operations 302 and/or 306 are a fail.

As mentioned above, the rewriting of the data block to the memory cell region 220 may include changing a voltage bias applied to the memory cell region 220. However, in cases where data blocks are rewritten multiple times according to various embodiments of the present inventive concept, time may be undesirably expended to change the voltage bias, since charging should be performed with respect to a relatively large capacitance to change the voltage bias. Therefore, after multiple data blocks are written in the above-described manner, the multiple data blocks may be rewritten at one time, thereby avoiding this expenditure of time. In the illustrated embodiment, a rewrite operation is once performed on 2 data blocks, but aspects of the present inventive concept are not limited thereto. That is to say, the number of data blocks processed by performing a rewrite operation once may be determined according to specifically implemented states.

Figure 7:
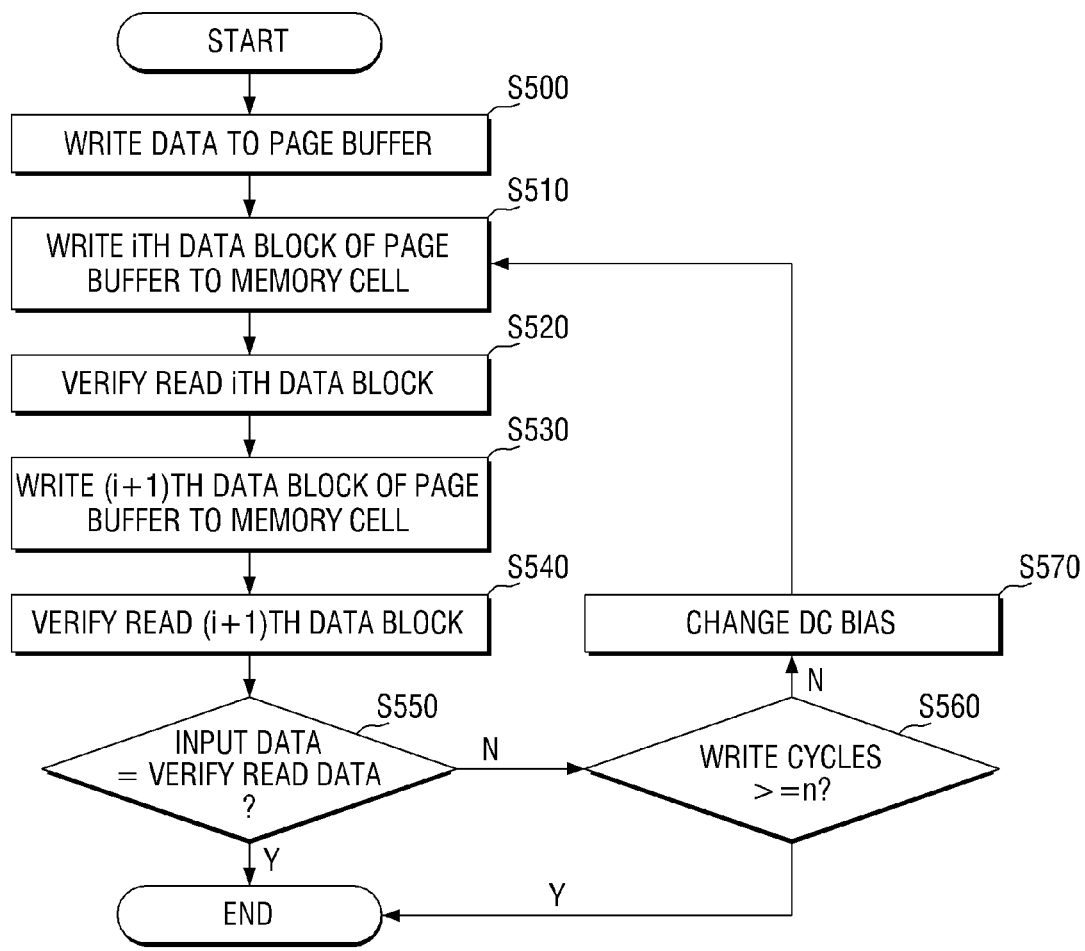
FIG. 7 is a flowchart for further reference in describing the method for driving a nonvolatile memory device associated with FIG. 6.

FIG. 7 is a flowchart for explaining the method for driving a nonvolatile memory device shown in FIG. 6.

Referring to FIG. 7, the method for driving a nonvolatile memory device shown in FIG. 6 includes writing data to the page buffer 230 (S500) and writing an ith data block of the page buffer 230 to the memory cell region 220 (S510). Here, i is a natural number in a range between 1 and N when it is assumed that the data stored in the page buffer 230 is divided into N data blocks, where N is a natural number of 2 or greater.

Next, the method for driving a nonvolatile memory device shown in FIG. 6 may include performing a verify-read operation on an ith data block of the memory cell region 220 (S520), writing an (i+1)th data block of the page buffer 230 to the memory cell region 220 (S530), and performing a verify-read operation on an (i+1)th data block of the memory cell region 220 (S540). In addition, the method for driving a nonvolatile memory device shown in FIG. 6 may include determining whether input data (that is, the ith and (i+1)th data blocks stored in the page buffer 230) is identical with the verified-read data (that is, the ith and (i+1)th data blocks of the memory cell region 220) (S550). If the input data is not identical with the verified-read data, it is determined whether the number of write cycles is not beyond a critical value (S560), the ith and (i+1)th data blocks are rewritten to the memory cell region 220 by changing a DC bias (S570). As described above with reference to FIG. 6, the ith and (i+1)th data blocks may be rewritten once to the memory cell region 220. In the embodiment shown in FIGS. 6 and 7, after steps S510 to S570 are performed on the ith and (i+1)th data blocks, the steps S510 to S570 may also be performed on (i+2)th and (i+1)th data blocks.

Figure 8:
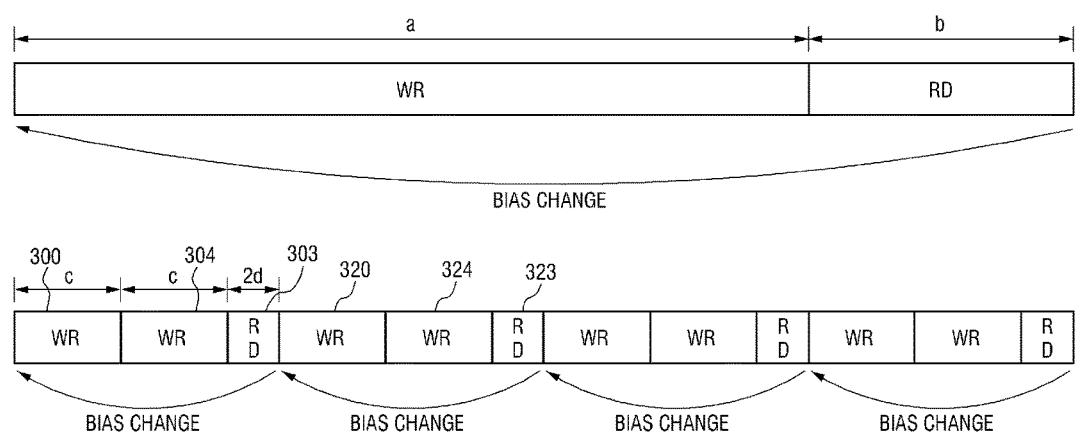
FIG. 8 is a diagram for reference in describing a method for driving a nonvolatile memory device according to still another embodiment of the present inventive concept.

FIG. 8 is a diagram illustrating a method for driving a nonvolatile memory device according to still another embodiment of the present inventive concept.

Referring to FIG. 8, the method for driving a nonvolatile memory device according to still another embodiment of the present inventive concept is different from the method shown in FIG. 4 in that after a first data block is written to a memory cell region 220 and a second data block is written to the memory cell region 220, a verify-read operation is performed on the first data block and the second data blocks of the memory cell region 220.

In some embodiments of the present inventive concept, the performing of the verify-read operation on the first data block and the second data blocks of the memory cell region 220 may include performing a verify-read operation on the first data block and the second data blocks of the memory cell region 220 at one time. That is to say, after performing a write operation 300 on the first data block and a write operation 304 on the second data block, a verify-read operation 303 may be performed on the first data block and the second data blocks at one time. In this case, a time for a verify-read operation on the first and second data blocks of the memory cell at one time may be shorter than a total time for performing verify-read operations on the first and second data blocks of the memory cell, respectively.

In some embodiments of the present inventive concept, the performing of the verify-read operation on the first data block and the second data blocks of the memory cell region 220 may include performing a verify-read operation on the first data block of the memory cell region 220 and then a performing a verify-read operation on the second data block of the memory cell region 220.

Figure 9:
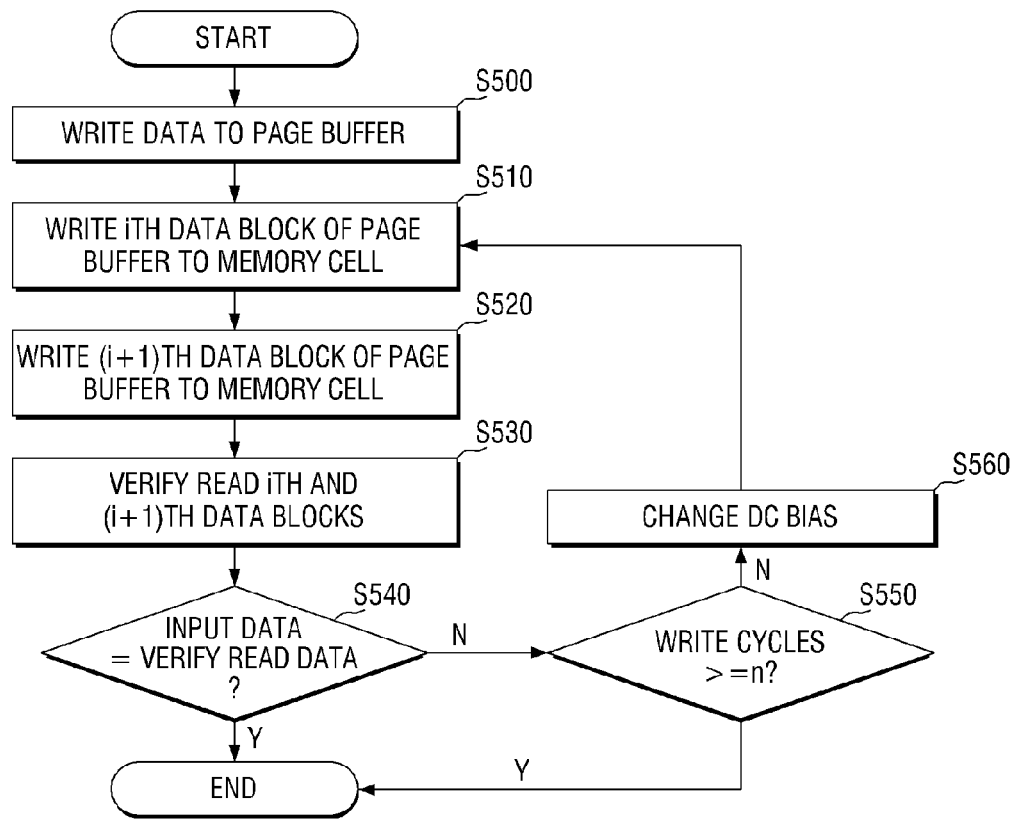
FIG. 9 is a flowchart for further reference in describing the method for driving a nonvolatile memory device associated with FIG. 8.

FIG. 9 is a flowchart for explaining the method for driving a nonvolatile memory device shown in FIG. 8.

Referring to FIG. 9, the method for driving a nonvolatile memory device shown in FIG. 8 may include writing data to the page buffer 230 (S500) and writing an ith data block of the page buffer 230 to the memory cell region 220 (S510). Next, method for driving a nonvolatile memory device shown in FIG. 8 may include writing an (i+1)th data block of the page buffer 230 to the memory cell region 220 (S520), and performing verify-read operations on the ith and (i+1)th data blocks of the memory cell region 220 (S530).

Next, the method for driving a nonvolatile memory device shown in FIG. 8 may include determining whether input data (that is, the ith and (i+1)th data blocks stored in the page buffer 230) is identical with the verified-read data (that is, the ith and (i+1)th data blocks of the memory cell region 220) (S540). If the input data is not identical with the verified-read data, it is determined whether the number of write cycles is not beyond a critical value (S550), the ith and (i+1)th data blocks may be rewritten to the memory cell region 220 by changing a DC bias (S560).

Figure 10:
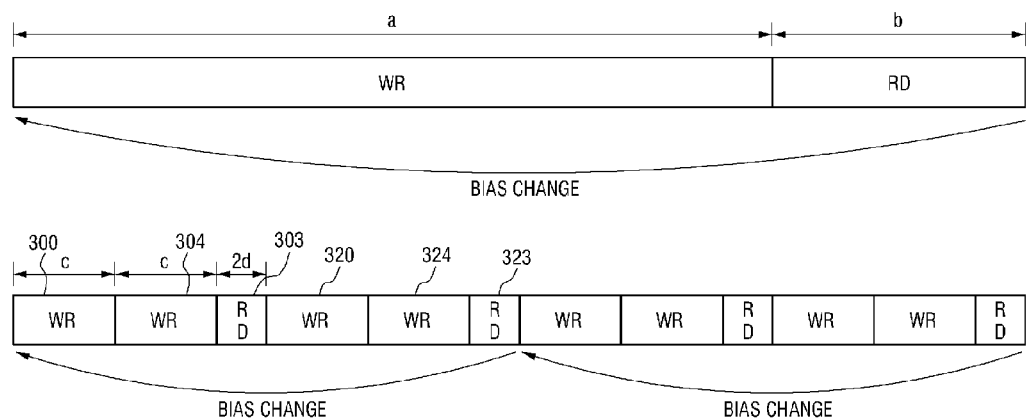
FIG. 10 is a diagram for reference in describing a method for driving a nonvolatile memory device according to yet another embodiment of the present inventive concept.

FIG. 10 is a diagram illustrating a method for driving a nonvolatile memory device according to still another embodiment of the present inventive concept.

Referring to FIG. 10, the method for driving a nonvolatile memory device according to still another embodiment of the present inventive concept is different from the method shown in FIG. 8 in that a data rewrite operation is more rarely performed. In detail, it is assumed that data of a page buffer 230 includes first to fourth data blocks. In the illustrated embodiment, the method for driving a nonvolatile memory device according to still another embodiment of the present inventive concept includes performing a verify-read operation 303 on the first data block and the second data block of the memory cell region 220, then performing write operations 320 and 324 on the third data block and the fourth data blocks, and finally performing verify-read operations on the third data block and the fourth data blocks. Next, the method for driving a nonvolatile memory device according to still another embodiment of the present inventive concept may include rewriting the first to fourth data blocks to the memory cell region 220 at one time.

Figure 11:
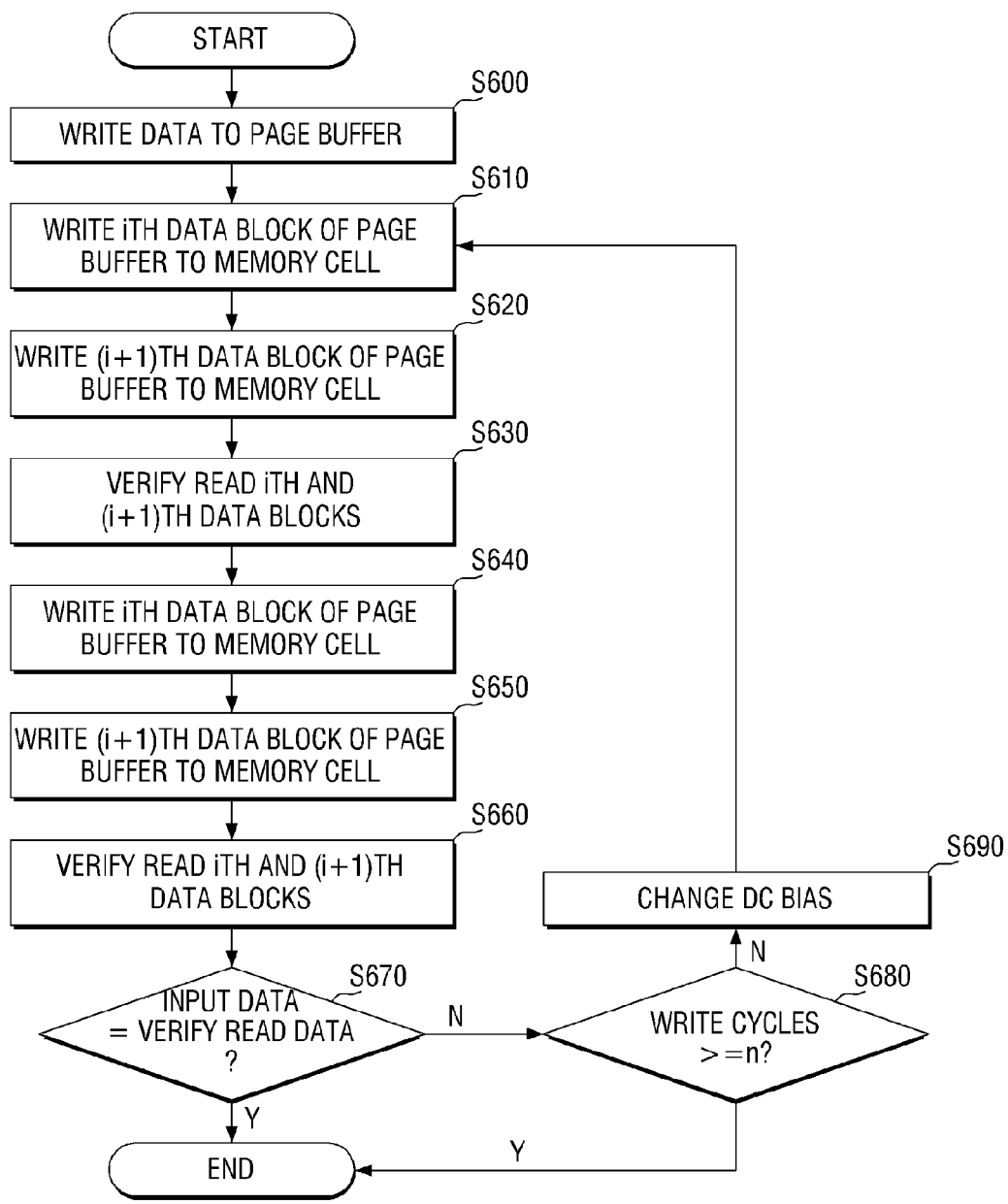
FIG. 11 is a flowchart for further reference in describing the method for driving a nonvolatile memory device associated with FIG. 10.

FIG. 11 is a flowchart for explaining the method for driving a nonvolatile memory device shown in FIG. 10.

Referring to FIG. 11, the method for driving a nonvolatile memory device shown in FIG. 10 may include writing data to the page buffer 230 (S600) and writing an ith data block of the page buffer 230 to the memory cell region 220 (S610). Next, the method for driving a nonvolatile memory device shown in FIG. 10 may include writing an (i+1)th data block of the page buffer 230 to the memory cell region 220 (S620), and performing a verify-read operation on ith and (i+1)th data blocks of the memory cell region 220 (S630).

Similarly, the method for driving a nonvolatile memory device shown in FIG. 10 may include writing an (i+2)th data block of the page buffer 230 to the memory cell region 220 (S640). Next, the method for driving a nonvolatile memory device shown in FIG. 10 may include writing an (i+3)th data block of the page buffer 230 to the memory cell region 220 (S650) and performing verify-read operations on (i+2)th and (i+3)th data blocks of the memory cell region 220 (S660).

Next, the method for driving a nonvolatile memory device shown in FIG. 10 may include determining whether input data (that is, the ith and (i+3)th data blocks stored in the page buffer 230) is identical with the verified-read data (that is, the ith and (i+3)th data blocks of the memory cell region 220) (S670). If the input data is not identical with the verified-read data, it is determined whether the number of write cycles is not beyond a critical value (S680), the ith and (i+3)th data blocks may be rewritten to the memory cell region 220 by changing a DC bias (S680).

Figure 12:
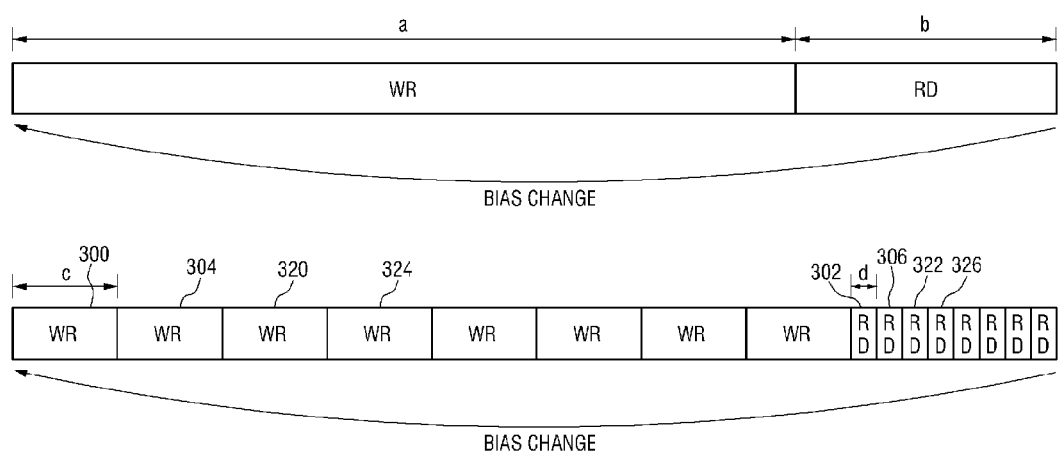
FIG. 12 is a diagram for reference in describing a method for driving a nonvolatile memory device according to another embodiment of the present inventive concept.

FIG. 12 is a diagram illustrating a method for driving a nonvolatile memory device according to still another embodiment of the present inventive concept.

Referring to FIG. 12, the method for driving a nonvolatile memory device according to still another embodiment of the present inventive concept is different from the above-described methods according to the previous embodiments in that write operations are consecutively performed on multiple data blocks and verify-read operations are then consecutively performed on the multiple data blocks. In detail, it is assumed that the data of a page buffer 230 is divided into first to Nth data blocks, where N is a natural number of 2 or greater. In the illustrated embodiment, the method for driving a nonvolatile memory device according to still another embodiment of the present inventive concept includes consecutively writing the first to Nth data blocks to a memory cell region 220 and consecutively performing verify-read operations on the first to Nth data blocks of the memory cell region 220.

In some embodiments of the present inventive concept, the performing of the verify-read operations on the first to Nth data blocks of the memory cell region 220 may include performing the verify-read operations on the first to Nth data blocks of the memory cell region 220, respectively. Meanwhile, in some embodiments of the present inventive concept, the performing of the verify-read operations on the first to Nth data blocks of the memory cell region 220 may include performing the verify-read operations on the first to Nth data blocks of the memory cell region 220 at one time.

Figure 13:
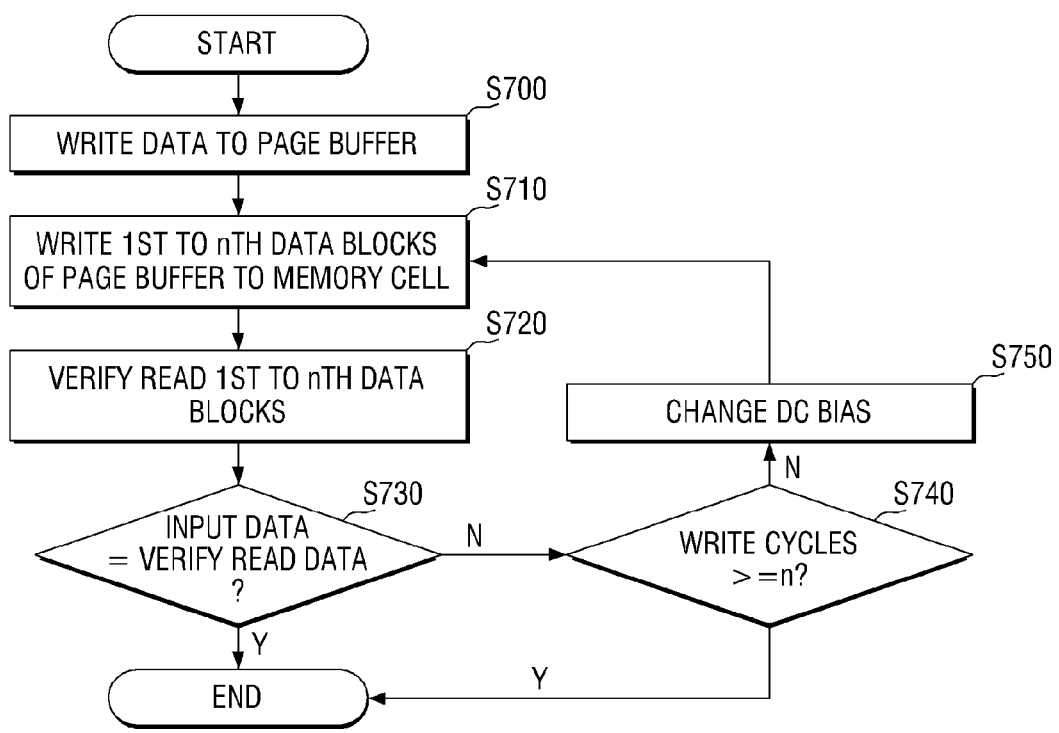
FIG. 13 is a flowchart for further reference in describing the method for driving a nonvolatile memory device associated with FIG. 12.

FIG. 13 is a flowchart for explaining the method for driving a nonvolatile memory device shown in FIG. 12.

Referring to FIG. 13, the method for driving a nonvolatile memory device shown in FIG. 12 may include writing data to the page buffer 230 (S700) and writing the first to Nth data blocks of the page buffer 230 to the memory cell region 220 (S710). Next, the method for driving a nonvolatile memory device shown in FIG. 12 may include performing verify-read operations on the first to Nth data blocks of the memory cell region 220 (S720).

Next, the method for driving a nonvolatile memory device shown in FIG. 12 may include determining whether input data (that is, the first to Nth data blocks stored in the page buffer 230) is identical with the verified-read data (that is, the first to Nth data blocks of the memory cell region 220) (S730). If the input data is not identical with the verified-read data, it is determined whether the number of write cycles is not beyond a critical value (S740), the first to Nth data blocks may be rewritten to the memory cell region 220 by changing a DC bias (S750).

Figure 14:
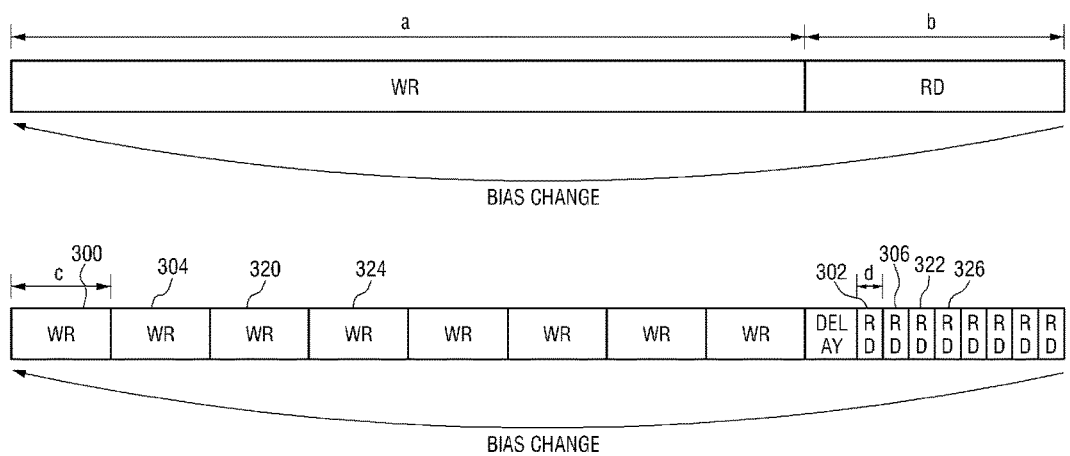
FIG. 14 is a diagram for reference in describing a method for driving a nonvolatile memory device according to still another embodiment of the present inventive concept.

FIG. 14 is a diagram illustrating a method for driving a nonvolatile memory device according to still another embodiment of the present inventive concept.

Referring to FIG. 14, the method for driving a nonvolatile memory device according to still another embodiment of the present inventive concept is different from the method shown in FIG. 12 in that it may further include delaying for a predetermined time after consecutively performing write operations on multiple data blocks and before consecutively performing verify-read operations on the multiple data blocks. In some embodiments of the present inventive concept, a length of the delaying time may be set to secure a write-after-read time (tWTR) of the nonvolatile memory device after the writing the first data block to the memory cell region 220 and before the performing the verify-read operation on the first data block of the memory cell region 220.

Figure 15:
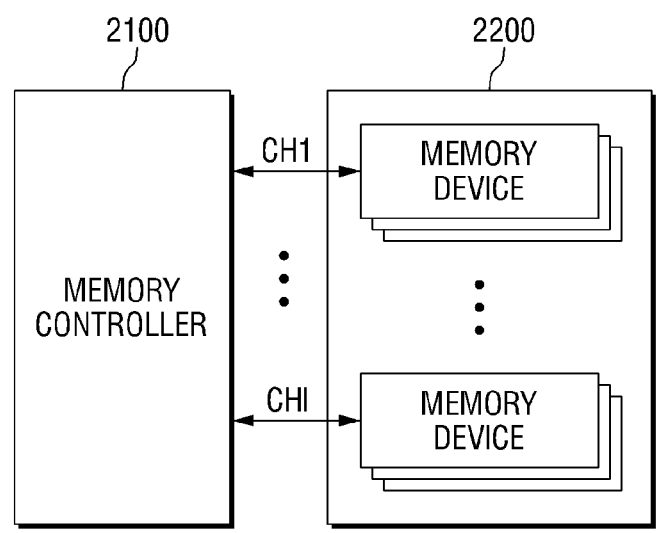
FIG. 15 is a block diagram of a memory system as an application example of the present inventive concept.

FIG. 15 is a block diagram for explaining an application example of the memory system shown in FIG. 1. For the sake of convenient explanation, the following description will focus on differences between the memory systems shown in FIGS. 1 and 15.

Referring to FIG. 15, the memory system 2000 as the application example of the memory system shown in FIG. 1 includes a memory controller 2100 and a memory device 2200.

The memory device 2200 may include a plurality of memory chips. The plurality of memory chips may be divided into a plurality of groups. The respective groups of the plurality of memory chips may interface with the memory controller 2100 through a common channel. For example, the respective groups of the plurality of memory chips may interface with the memory controller 2100 through first to 1th channels CH1 to CHl.

In the memory system 2000 shown in FIG. 15, the plurality of memory chips may be configured in substantially the same manner with the memory device 200 shown in FIG. 1. The plurality of memory chips may perform a first program of a main program operation using multiple pieces of back-up page data stored in a page buffer.

While a plurality of memory chips connected to one channel is exemplified in FIG. 15, one memory chip may be connected to one channel.

For example, the memory systems 1 and 2000 shown in FIGS. 1 and 15 may be implemented as a computer, an ultra mobile personal computer (UMPC), a work station, a netbook, a personal digital assistant (PDA), a portable computer, a web tablet, a wireless phone, a mobile phone, a smart phone, an e-book, a portable multimedia player (PMP), a potable game console, a navigation device, a black box, a digital camera, a 3-dimensional (3D) television, a digital audio recorder, a digital audio player, a digital picture recorder, a digital picture player, a digital video recorder, a digital video player, a device capable of transmitting/receiving information in wireless environments, one of various electronic devices constituting a home network, one of various electronic devices constituting a computer network, one of various electronic devices constituting a telematics network, RFID devices, or embedded computing systems.

Figure 16:
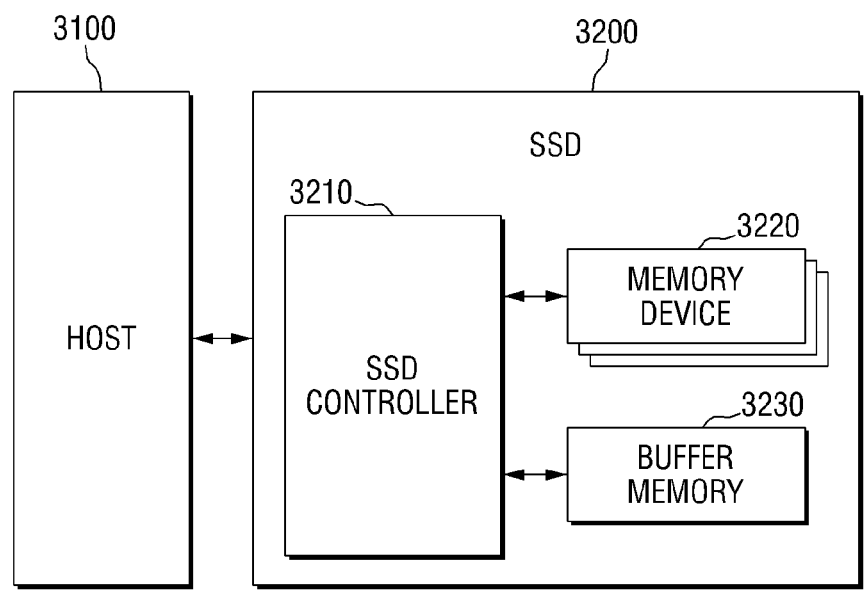
FIG. 16 is a block diagram of a user system including a solid state drive as another application example of the present inventive concept.

FIG. 16 is a block diagram for explaining a user system including a solid state drive.

Referring to FIG. 16, the user system 3000 includes a host 3100 and a solid state drive (SSD) 3200.

The SSD 3200 includes an SSD controller 3210, a memory device 3220 and a buffer memory 3230.

The SSD controller 3210 may be configured to interface with the host 3100. The SSD controller 3210 may access the memory device 3220 in response to a request from the host 3100. The SSD controller 3210 may transfer data received from the host 3100 to the buffer memory 3230.

The memory device 3220 may be provided as a storage medium of the SSD 3200. The memory device 3220 may include a plurality of memory chips. Each of the plurality of memory chips may be configured in substantially the same manner as the memory device 200 shown in FIG. 1. The plurality of memory chips may perform a first program of a main program operation using multiple pieces of back-up page data stored in a page buffer The buffer memory 3230 may temporarily store data received from the SSD controller 3210. During a program operation of the memory device 3220, the buffer memory 3230 may transfer the temporarily stored data to the memory device 3220. In order to provide sufficient buffering capacity, the buffer memory 3230 may include a synchronous DRAM, but aspects of the present inventive concept are not limited thereto.

The buffer memory 3230 positioned outside the SSD controller 3210 is illustrated in FIG. 16, but aspects of the present inventive concept are not limited thereto. The buffer memory 3230 may be provided as an internal component of the SSD controller 3210.

Figure 17:
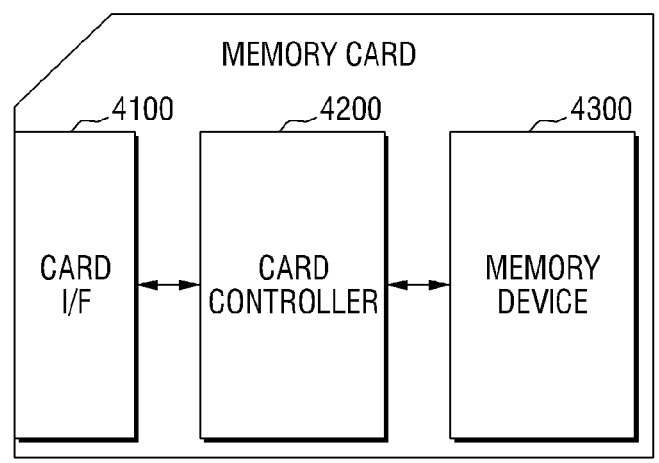
FIG. 17 is a block diagram of a memory card as still another application example of the present inventive concept.

FIG. 17 is a block diagram for explaining a memory card including a nonvolatile memory device according to the present inventive concept.

Referring to FIG. 17, the memory card 4000 includes a card I/F 4100, a card controller 4200, and a memory device 4300.

The card I/F 4100, including a plurality of pins, may interface with a host. The plurality of pins may include command pins, data pins, clock pins, power pins, and so on, but aspects of the present inventive concept are not limited thereto. The number of pins may vary in various manners according to the kind of the memory card 4000.

The card controller 4200 may be configured to write data to the memory device 4300 or to read data from the memory device 4300 in response to a request from the host.

The memory device 4300 may be configured in substantially the same manner with the memory device 200 shown in FIG. 1. The memory device 4300 may perform a first program of a main program operation using multiple pieces of back-up page data stored in a page buffer.

Examples of the memory card 4000 may include a PC card such as a personal computer memory card international association (PCMCIA) card, a compact flash (CF) card, a smart media card (e.g., SM or SMC), a memory stick, a multimedia card (e.g., MMC, RS-MMC or MMCmicro), a SD card (e.g., SD, miniSD, microSD and SDHC), or a universal flash storage (UFS).

Figure 18:
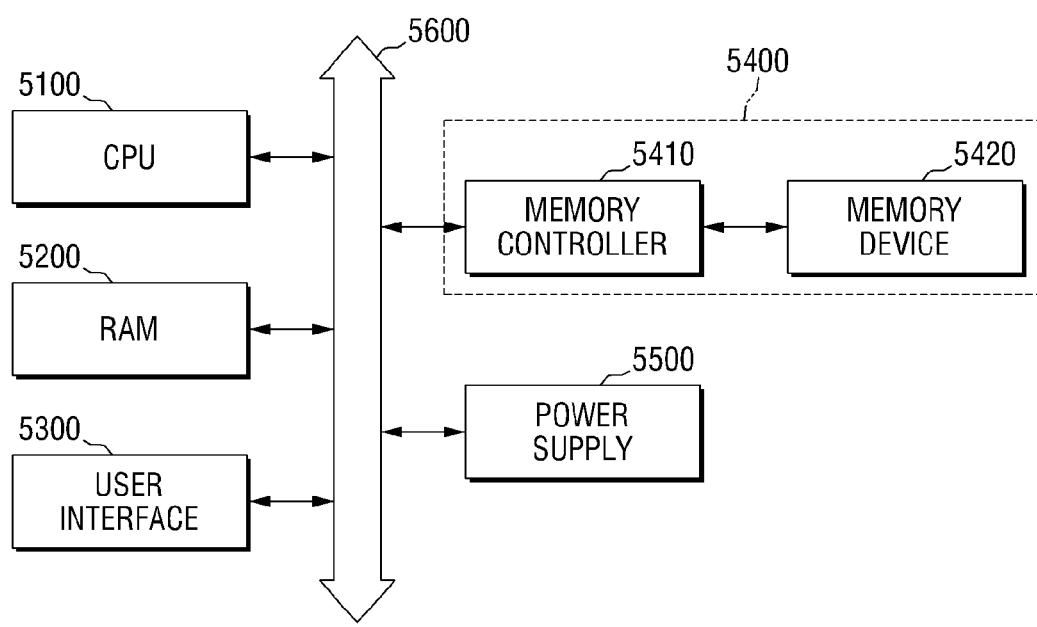
FIG. 18 is a block diagram of a computing system as yet another application example of the present inventive concept.

FIG. 18 is a block diagram for explaining a computing system including a nonvolatile memory device according to the present inventive concept.

Referring to FIG. 18, the computing system 5000 include a central processing unit (CPU) 5100, a random access memory (RAM) 5200, a user interface 5300, a memory system 5400 and a power supply 5500.

The memory system 5400 may be connected to the CPU 5100, the RAM 5200, the user interface 5300 and a power supply 5500 through the memory system 5400.

The memory system 5400 may be configured in substantially the same manner with the memory device 200 shown in FIG. 1. The memory system 5400 may also be configured in substantially the same manner with the memory system 2000 shown in FIG. 12. The data provided through the user interface 5300 or processed by the CPU 5100 may be stored in the memory system 5400.

The memory device 5420 connected to a system bus 5600 through the memory controller 5410 is illustrated in FIG. 18, but aspects of the present inventive concept are not limited thereto. In a modified embodiment, the memory device 5420 may be directly connected to the system bus 5600.

Meanwhile, the computing system 5000 may be configured to include both of the memory systems 1 and 2000 shown in FIGS. 1 and 15.

The steps of a method or algorithm described in connection with the embodiments disclosed herein can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, or any other form of storage medium including a network storage medium. An exemplary storage medium can be coupled to the processor such the processor can read information from, and write information to, the storage medium. In the alternative, the storage medium can be integral to the processor. The processor and the storage medium can also reside in an application specific integrated circuit (ASIC). The ASIC can reside in a user terminal. Alternatively, the processor or the storage medium can reside in a user terminal as an individual component.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the inventive concepts.

What is claimed is:

1. A method for driving a nonvolatile memory device, the method comprising:
    storing data in a page buffer such that both a first data block among the data and a different second data block among the data are stored in the page buffer;
    writing the first data block stored in the page buffer to a first memory cell region, and performing a verify-read operation on the first data block written to the first memory cell region; and
    writing the second data block stored in the page buffer to a second memory cell region, and performing a verify-read operation on the second data block written to the second memory cell region.

2. The method of claim 1, wherein a unit data size of a write operation performed in each of the first and second memory cell regions is smaller than the data size of the page buffer.

3. The method of claim 1, wherein a unit data size of each verify-read operation performed in the first and second memory cell regions is smaller than the data size of the page buffer.

4. The method of claim 1, further comprising:
    rewriting the first data block to the first memory cell region after performing the verify-read operation on the first data block of the memory cell region and before writing the second data block to the second memory region.

5. The method of claim 4, further comprising changing a bias voltage applied to the first memory cell region after performing the verify-read operation and before rewriting the first data block to the first memory cell region.

6. The method of claim 4, wherein the writing and rewriting of the first data block comprise an incremental step pulse programming (ISPP) of the first memory cell region.

7. The method of claim 1, further comprising rewriting both the first data block and the second data block to the first and second memory cell regions, respectively, at the same time after performing the verify-read operation on the second data block.

8. The method of claim 7, wherein a size of the data rewritten once to the first and second memory cell regions is larger than a size of the data written once to the first and second memory cell regions.

9. The method of claim 7, wherein a size of the data rewritten once to the first and second memory cell regions is larger than a size of the data verified-read once to the first and second memory cell regions.

10. A method for driving a nonvolatile memory device, the method comprising:
    storing data in a page buffer such that both a first data block among the data and a different second data block among the data are stored in the page buffer;
    writing the first data block to a memory cell region;
    writing the second data block to the memory cell region after writing the first data block to the memory cell region; and
    performing a verify-read operation on the first and second data blocks of the memory cell region.

11. The method of claim 10, wherein the performing of the verify-read operation on the first data block and the second data block of the memory cell region comprises performing the verify-read operation on the first data block of the memory cell region and then performing the verify-read operation on the second data block of the memory cell region.

12. The method of claim 10, wherein the performing of the verify-read operation on the first and second data blocks of the memory cell region comprises performing the verify-read operation on both the first and second data blocks of the memory cell region at the same time.

13. The method of claim 12, wherein a time for performing the verify-read operation on both the first and second data blocks of the memory cell region at the same time is shorter than a total time for separately performing the verify-read operation on the first and second data blocks of the memory cell region, respectively.

14. A method for driving a nonvolatile memory device, the method comprising:
dividing the data stored in the page buffer into first to Nth data blocks, where N is a natural number of 2 or greater;
consecutively writing the first to Nth data blocks to memory cell regions, respectively;
delaying for a predetermined time; and
consecutively performing verify-read operations on the first to Nth data blocks of the memory cell regions.

15. The method of claim 14, wherein a length of the delaying time is set to secure a write-after-read time (tWTR) of the nonvolatile memory device after the writing the first data block to the memory cell region and before the performing the verify-read operation on the first data block of the memory cell region.

16. A method for driving a nonvolatile memory device which includes a page buffer connected to a nonvolatile memory array including a plurality of resistive memory cells, the method comprising:
loading the page buffer with N blocks of data, where N is a natural number of 2 or more; and
performing program sequences in succession for the N blocks respectively, wherein each program sequence comprises:
writing a one of the N blocks stored in the page buffer to the memory array;
read-verifying the one of the N blocks written to the memory array to obtain a read-verity result;
rewriting the one of the N blocks to the memory array when the read-verify result is a fail; and
completing the program sequence for the one of the N blocks when the read-verify result is a pass.

17. The method of claim 16, wherein the writing and rewriting of the resistive memory cells includes application of a write current at a DC bias voltage, and wherein each program sequence further comprises:
changing the DC bias voltage after obtaining the read-verify result as a fail and before the rewriting the one of the N blocks to the memory array.

18. The method of claim 17, wherein each program sequence further comprises:
read-verifying the rewritten one of the N blocks stored to the memory array to obtain another read-verify result;
again rewriting the one of the N blocks stored in the page buffer to the memory array when the another read-verify result is a fail; and
conducting the program sequence on another one of the N blocks when the another read-verify result is a pass.

19. The method of claim 16, wherein a data size capacity of the page buffer is N times a data size of each of the N blocks.

20. The method of claim 16, wherein nonvolatile memory device is one of a phase change random access memory (PRAM), a phase change memory (PCM), a resistive RAM (RRAM), or a magnetic RAMs (MRAM).

* * * * *